United States Patent [19]

Kling

[11] 4,449,161
[45] May 15, 1984

[54] ONE SHOT FIRING CIRCUIT FOR POWER TOOLS

[75] Inventor: Larry K. Kling, Raleigh, N.C.

[73] Assignee: The Black & Decker Manufacturing Company, Towson, Md.

[21] Appl. No.: 398,854

[22] Filed: Jul. 16, 1982

[51] Int. Cl.³ .......................................... H01H 47/32
[52] U.S. Cl. .................... 361/152; 227/131; 307/252 UA; 318/132; 361/190; 361/205
[58] Field of Search ............... 361/152, 160, 189, 190, 361/205; 307/252 N, 252 UA; 318/132; 310/30; 227/131

[56] References Cited

U.S. PATENT DOCUMENTS

| 3,171,074 | 2/1965 | Momberg et al. | 318/246 |
|---|---|---|---|
| 3,179,866 | 4/1965 | Doyle et al. | 318/125 |
| 3,206,615 | 9/1965 | LaPointe | 307/252 N |
| 3,215,864 | 11/1965 | Doyle et al. | 307/246 |
| 3,258,668 | 6/1966 | Milligan | 318/795 |
| 3,292,068 | 12/1966 | Holden | 318/327 |
| 3,345,546 | 10/1967 | Beltramo | 318/132 |
| 3,418,489 | 12/1968 | Platzer, Jr. | 307/114 |
| 3,434,026 | 3/1969 | Doyle | 318/125 |
| 3,469,122 | 9/1969 | Doherty | 310/30 |
| 3,517,222 | 6/1970 | Wallentowitz | 307/592 |
| 3,551,699 | 12/1970 | Karwacki | 307/246 |
| 3,573,594 | 4/1971 | Danielsen | 320/1 |
| 3,612,904 | 10/1971 | Moe | 307/252 N |
| 3,621,296 | 11/1971 | Berger | 307/252 N |
| 3,640,089 | 2/1972 | Frazier | 62/320 |
| 3,657,564 | 4/1972 | Hollis | 307/252 K |
| 3,662,190 | 5/1972 | Naber | 307/252 N |
| 3,668,432 | 6/1972 | Rhodes | 307/443 |
| 3,671,780 | 6/1972 | Lefferts | 307/252 UA |
| 3,680,070 | 7/1972 | Nystuen | 222/14 |
| 3,715,605 | 2/1973 | Naber | 307/246 |
| 3,757,141 | 9/1973 | Palsson et al. | 307/252 N |
| 3,793,538 | 2/1974 | Rogers | 307/252 N |
| 3,846,644 | 11/1974 | Takagi et al. | 307/252 J |
| 3,846,648 | 11/1974 | Scott | 307/592 |
| 3,870,903 | 3/1975 | Taylor | 307/252 N |
| 3,873,854 | 3/1975 | Lamb | 307/252 N |
| 3,896,369 | 7/1975 | Nakata | 323/238 |
| 3,903,476 | 9/1975 | Gawron et al. | 323/327 |
| 3,936,706 | 2/1976 | Hamstra | 361/153 |
| 3,947,754 | 3/1976 | Wechsler | 323/300 |
| 3,971,969 | 7/1976 | Wines et al. | 361/205 |
| 3,974,419 | 8/1976 | Agams, Jr. et al. | 315/241 P |
| 3,974,857 | 2/1974 | Milovancevic | 137/559 |
| 3,991,343 | 11/1976 | Delpy | 315/194 |
| 4,016,433 | 4/1977 | Brooks | 307/252 C |
| 4,058,751 | 11/1977 | Brooks | 315/200 A |
| 4,183,453 | 1/1980 | Barrett et al. | 227/131 |
| 4,220,910 | 9/1980 | Chiba et al. | 307/252 N X |
| 4,245,166 | 1/1981 | Rankin | 307/252 N |
| 4,246,499 | 1/1981 | Iida | 397/599 |
| 4,264,830 | 4/1981 | Maurer et al. | 307/252 J |
| 4,270,058 | 5/1981 | Schornack | 307/140 |

Primary Examiner—Harry E. Moose, Jr.
Attorney, Agent, or Firm—Harness, Dickey & Pierce

[57] ABSTRACT

A one shot firing circuit for electrically powered tools is described which includes a manually operable normally open trigger switch connected electrically in series with a solenoid coil and an AC power source for controlling the supply of electrical power to both the firing circuit and the solenoid, such that when the trigger switch is open, the path of current flow to the solenoid coil is physically interrupted. The firing circuit also includes an SCR connected electrically in series with the trigger switch, the solenoid coil and the AC power source, for controlling the flow of current through the solenoid coil after the trigger switch has been closed. The firing circuit further includes a timing circuit connected to the gate of the SCR which is operable in response to the closing of the trigger switch to provide a predeterminable delay after the trigger switch is closed before enabling the SCR to conduct and permit a unidirectional current impulse to flow through the solenoid coil of sufficient magnitude to energize the solenoid. The timing circuit also operates to disable further unidirectional current impulses through the solenoid coil once the solenoid has been energized until a predeterminable delay after the trigger switch has opened.

33 Claims, 2 Drawing Figures

ONE SHOT FIRING CIRCUIT FOR POWER TOOLS

BACKGROUND AND SUMMARY OF THE INVENTION

The present invention relates generally to portable electric power tools and particularly to control circuits for tools such as electrically powered staplers or nailers.

Electrically powered staplers or nailers typically employ a solenoid having a reciprocable armature which is operable to eject a staple or nail from the device and drive it into an article. When the winding or coil of the solenoid is energized by a current impulse of sufficient magnitude, the magnetic field created thereby causes the armature to move axially against the resistance of a tension spring with the force required to eject and drive the staple or nail. The stapler/nailer also typically includes a spring loaded trigger which when depressed or squeezed by the operator actuates a trigger or firing circuit controlling the energization of the solenoid.

Due to cost and other manufacturing considerations, it is highly desirable to use the same trigger switches in tools such as power staplers or nailers as are used in other types of power tools. However, the current levels required to operate the solenoid in a power stapler or nailer are substantially greater than the current drawn by a conventional motor-driven power tool such as a drill or rotary saw. Accordingly, since the physical size of such trigger switches is quite small, it has been the practice in the industry to use the trigger switch for a power stapler or nailer to control only the switching of the semiconductor circuit component which controls the energization of the solenoid, so that the trigger switch does not carry the full current loads required to operate the solenoid. An example of this type of circuit design is shown in U.S. Pat. No. 4,183,454, issued Jan. 15, 1980, to Barrett et al.

Since the solenoids for this application are capable of operating within one half cycle of the AC power waveform to drive a staple or nail, the most common circuit element used to control the energization of the solenoid is a silicon controlled rectifier (SCR), also known as a reverse blocking triode thyristor. Although the reliability of SCR's are well known by those skilled in the art, it is nevertheless still possible for an inadvertent misfiring of the fastening device to occur. For example, internal heating of the SCR may cause the SCR to "break down", thereby permitting a current flow through the solenoid coil of operating magnitude. Additionally, power surges in the supply line, such as when a fluorescent light is switched on, may also cause the SCR to suddenly conduct without actuation of the stapler/nailer trigger by the operator. Furthermore, if the particular SCR does not meet the manufacturer's specifications, the forward blocking current or voltage characteristics may be such as to permit the SCR to inadvertently conduct under some conditions.

Accordingly, it is a principal object of the present invention to provide a novel firing circuit for a portable electrically powered fastening device of an economical design which will isolate the solenoid drive of a device from the line voltage powering the device except when the trigger is actuated.

It is a more specific object of the present invention to provide a firing circuit which includes a manually operable normally open trigger switch connected electrically in series with the solenoid coil and the source of AC electrical power, which is operable to physically interrupt the path of current flow to the solenoid coil at all times other than when the trigger is actuated by the operator.

It is an additional object of the present invention to provide a firing circuit which operates to delay the energization of the solenoid for a predeterminable period once the trigger has been activated.

It is a further object of the present invention to provide a firing circuit which operates to disable any further energization of the solenoid after the trigger has been released for a predeterminable time delay.

In accordance with the foregoing objects, the present invention provides a "one shot" firing circuit which includes a manually operable normally open trigger switch connected electrically in series with the solenoid coil and the source of alternating current electrical power for controlling the supply of electrical power to both the firing circuit and the solenoid, such that when the trigger switch is open, the path of current flow to the solenoid coil is physically interrupted. The firing circuit also includes controlled conduction means, such as an SCR, connected electrically in series with the trigger switch, the solenoid coil and the AC power source, for controlling the flow of current through the solenoid coil after the trigger switch has been closed. The firing circuit further includes a timing circuit connected to the gate of the SCR which is operable in response to the closing of the trigger switch to provide a predeterminable delay after the trigger switch is closed before enabling the SCR to conduct and permit a unidirectional current impulse to flow through the solenoid coil of sufficient magnitude to energize the solenoid. The timing circuit is also adapted to enable the conduction of the SCR upon a positive going zero crossing of a voltage waveform from the AC power source, such that a single positive polarity half cycle current waveform is applied to the solenoid coil. The timing circuit also operates to disable further unidirectional current impulses through the solenoid coil once the solenoid has been energized until a predeterminable delay after the trigger switch has opened.

Additional advantages and features of the present invention will become apparent from a reading of the Detailed Description of the Preferred Embodiment which makes reference to the following set of drawings in which:

DETAILED DESCRIPTION OF THE PREFERRED EMBODIMENT

Figure 1:
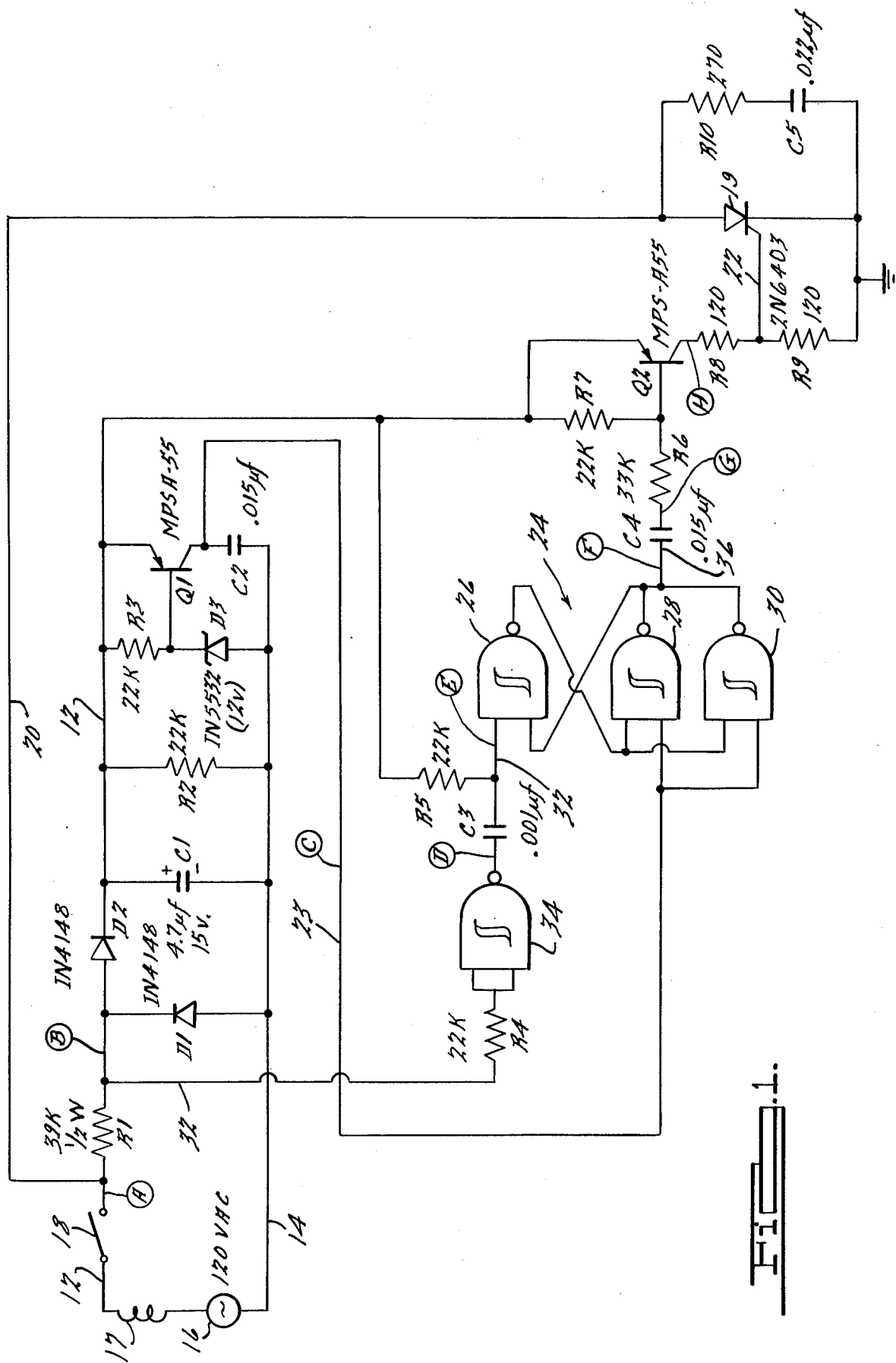
FIG. 1 is a schematic diagram of a one shot firing circuit according to the present invention.

Referring to FIG. 1, a schematic diagram of a one shot firing circuit 10 for power tools such as power staplers or nailers, according to the present invention is shown. The firing circuit 10 is provided with a pair of conductors 12 and 14 which are adapted to be connected across a 120 volt AC power supply 16 in series with a suitable inductive load, such as a solenoid coil 17. A manually actuable trigger switch 18 is provided along conductor 12, which functions to control the supply of electrical power to both the firing circuit 10 and solenoid coil 17. Trigger switch 18 is a normally open single pole-single throw (SPST) switch, which is adapted to close in response to the squeezing of the stapler/nailer trigger by the operator. Since trigger switch 18 is connected in series with the AC power supply 16 and the solenoid coil 17, it will be appreciated that when the switch is open the path of current flow to the solenoid coil is mechanically or physically interrupted, thereby preventing the stapler/nailer from misfiring.

As will be more fully appreciated below, the firing circuit 10 is adapted to provide a 60-80 millisecond delay after the trigger switch 18 is closed before permitting current to flow through the solenoid coil 17. This delay permits the switch 18 to "debounce" before the heavy current needed to operate the solenoid surges through the switch. The delay insures that the switch contacts have settled and made firm contact in order to prevent arcing and the consequent deterioration of the switch contacts due to a welding action which may occur when the contact surface area is small. Accordingly, the trigger switch 18 need only "make" or connect firing circuit 10 to the line voltage at the minimal current draw required by the timing circuitry of the firing circuit. Since the solenoid coil 17 is connected electrically in series with the AC power supply 16, the current draw due to the timing circuitry will also flow through the solenoid coil. However, this minor current flow is well below that required to energize the solenoid coil sufficiently to actuate the solenoid armature.

The switching element which controls the flow of current though the solenoid coil 17 after the trigger switch 18 closes is a silicon controlled rectifier (SCR) 19, which is connected electrically in series with the trigger switch along a conductor 20. The SCR 19 is adapted to "turn on" and conduct positive polarity half cycles of the sinusoidal voltage signal on conductor 20 in response to an appropriate signal or pulse applied to the gate electrode of the SCR along a conductor 22. The voltage signal waveform on conductor 20 is illustrated by the top-most graph in FIG. 2, the voltage being taken at point "A" in FIG. 1. Although other suitable controlled conduction means may be employed with the present invention, one advantage of the SCR is that once the SCR 19 has turned on at the beginning of or during a positive half cycle of the voltage signal on conductor 20, it will stay on and continue to conduct until the voltage drops into the following negative half cycle. At this point, the SCR will automatically "turn off" or cease to conduct any further positive half cycles of the voltage signal until another appropriate signal is applied to the gate electrode of the SCR.

Figure 2:
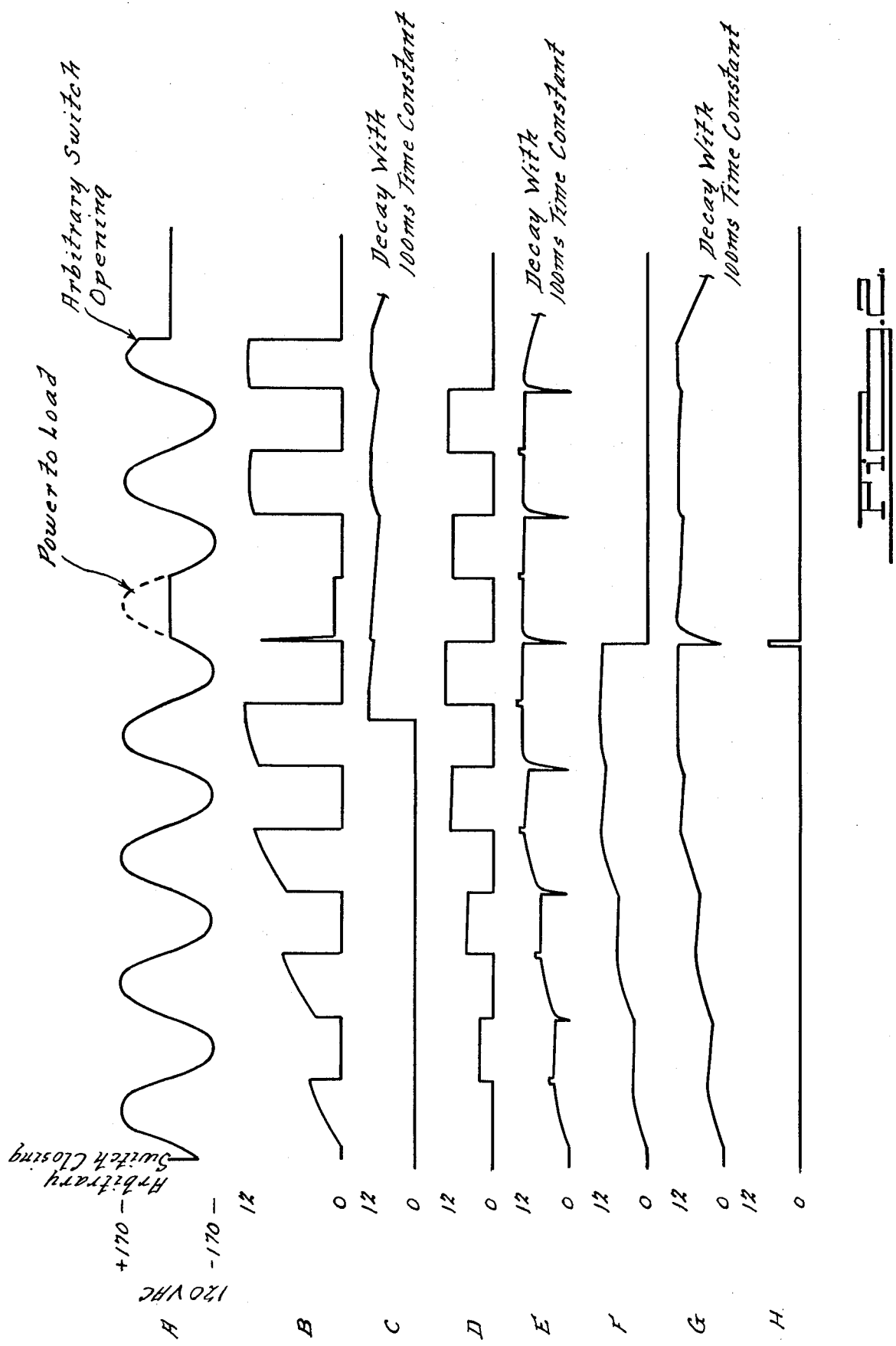
FIG. 2 is a graph illustrating the simultaneous voltage waveforms at selected points in the firing circuit between an arbitrary trigger switch closing and an arbitrary trigger switch opening.

As may be best seen with reference to graph "A" of FIG. 2, the firing circuit 10 is adapted to permit current to flow through the solenoid coil 17 only during a single positive polarity half cycle of the voltage signal between an arbitrary trigger switch closing and an arbitrary trigger switch opening. It should also be noted that since the solenoid coil 17 presents only a small amount of inductance, the current lag with respect to the voltage waveform "A" of FIG. 2 will be insignificant. Accordingly, when the SCR 19 is rendered conductive a unidirectional current impulse will flow through the solenoid coil which comprises substantially all of a single positive polarity half cycle current waveform from the AC power supply 16.

After the firing circuit 10 has "fired" and the solenoid has operated to eject a staple or nail, it will be appreciated that the current flow through the switch 18 will again decrease to the minimal current draw required by the timing circuitry. Thus, it should be understood that the trigger switch 18 need only "make or break" the standard line voltage at currents on the order of 4.3 milliamps peak. Additionally, since the SCR 19 only conducts and permits current flow through the solenoid coil 17 for only one positive polarity half cycle, the trigger switch 18 need only withstand the heavy solenoid operating current for no more than 8.33 milliseconds. The combination of these considerations allows the use of an inexpensive light-duty switch construction for trigger switch 18, even though the switch is connected in series with the power supply 16, solenoid coil 17 and SCR 19, and the switch is opened and closed repeatedly during normal operation. This advantageous result enables the firing circuit 10 to positively break the line, and yet permits low-cost switch construction to be employed which were previously only used to interrupt electrical power to the gate electrode of the SCR. In one form of the present invention, switch model No. S-9022, manufactured by Stackpole Components Co. or equivalent, is used for the trigger switch 18.

Referring now to the timing circuitry, this circuitry is connected generally in parallel with the SCR 19 and has an output connected to the gate of the SCR via conductor 22. The timing circuitry includes a first controlled conduction device, transistor Q1, and a first delay circuit for controlling the conduction of the transistor Q1 in response to the closing of the trigger switch 18. The timing circuitry is also provided with a second controlled conduction device, transistor Q2, and a toggling circuit (which includes an RS flip flop 24) for controlling the conduction of the transistor Q2 in response to the conduction of the transistor Q1 and a positive going zero crossing of the voltage signal on conductor 20.

The first delay circuit generally comprises a half wave rectifier (diodes D1 and D2), a passive RC network (capacitor C1 and resistors R1, R2 and R3) in association with the half wave rectifier, and a threshold conduction device (Zener diode D3) which enables the conduction of the transistor Q1 in response to the voltage across capacitor C1. In particular, after the trigger switch 18 closes, a gradually increasing squarewave voltage waveform will appear at point "B" on conductor 12, as illustrated in FIG. 2. The half wave rectifier provided by diodes D1 and D2 permits capacitor C1 to gradually charge over several positive polarity half cycles of the voltage signal. Accordingly, the voltage at point "B" will vary between −0.65 volts and +0.65 volts (the drop across the diodes) plus the voltage on the capacitor C1. The capacitor C1 will continue to charge until the voltage across the capacitor exceeds the Zener diode D3 breakdown or threshold voltage (+12 volts) plus the base-emitter barrier voltage $V_{be}$ of the transistor Q1. When this occurs the transistor Q1 will conduct, enabling the capacitor C2 to rapidly charge, and generate an appropriate digital logic signal (a HI logic state) on conductor 23 (waveform "C" in FIG. 2).

The 60–80 millisecond delay between the time when the trigger switch 18 is closed and the circuit 10 fires (i.e., the SCR 19 conducts) is provided principally by the time required to charge the capacitor C1 to a voltage exceeding the breakdown voltage of the Zener diode D3. This also permits a sufficient voltage on conductor 12 to build up, which will ensure that when the transistor Q2 switches on the SCR 19 will conduct. This delay, of course, need only be of a sufficient duration to "debounce" the trigger switch 18, and may be suitably varied in the appropriate application by modifying the time constant provided by resistors R1 and R2 and the capacitor C1.

After the transistor Q1 conducts, the firing circuit 10 is adapted to "fire" on the next positive going zero crossing of the voltage signal on conductor 20. This is achieved through the toggling circuit which includes an "RS" flip flop 24 comprised of three NAND gates 26, 28 and 30. The third NAND gate 30 is used to provide additional drive capacity, and to also make use of the fourth NAND gate in a 4093 quad 2-input NAND Schmitt trigger I.C. package. The toggling circuit also includes a Schmitt trigger (NAND gate 34), a first differentiation RC network (capacitor C3 and resistor R5) connected to the output of the Schmitt trigger, and a second differentiation RC network (capacitor C4 and resistor R6) connected between the output of the flip flop 24 and the transistor Q2.

The reset input to the flip flop 24 is provided by the digital logic signal on conductor 23. The set input is derived from the signal on conductor 32, which is processed through the Schmitt trigger NAND gate 34. The NAND gate 34 is used to convert the low-frequency sine wave voltage signal on line 32 into a fast-rise square wave. The output waveform of the NAND gate 34 at point "D" is illustrated in FIG. 2. The square wave output from NAND gate 34 is derivated by capacitor C3 and resistor R5 which are operable to generate a negative going spike on each positive going zero crossing of the voltage signal on conductor 12 at point "E" on conductor 32, as illustrated in FIG. 2. Accordingly, the voltage signal input to the NAND gate 26 on conductor 32 alternates momentarily from a HI logic state to a LO logic state at every positive going zero crossing. However, the voltage signal input to the NAND gates 28 and 30 on conductor 24 stays in a logic LO state until the transistor Q1 conducts, at which time it changes to a logic HI state. With the voltage signal input to NAND gates 28 and 30 in a logic HI state, the output of the flip flop 24 on conductor 36 will toggle on the next LO logic state input to the NAND gate 26, that is, when the next positive going zero crossing occurs. The output voltage of the flip flop 24 at point "F" on conductor 36 is illustrated in FIG. 2.

When the output of the flip flop 24 toggles or is "set", (i.e., on the HI to LO transition), the transistor Q2 will be switched on for a period determined by the RC combination of capacitor C4 and resistor R6. The voltage signal at point "G" on the conductor 36 and the voltage output of the transistor Q2 at point "H" are illustrated in FIG. 2. As will be appreciated by those skilled in the art, the output pulse from the transistor Q2 need only be of a sufficient magnitude and duration to provide the appropriate "turn on" signal to the gate electrode of the SCR 19. It should also be noted that a "snubber" circuit, comprising resistor R10 and a capacitor C5, is connected across the anode and cathode electrodes of the SCR to prevent line transients from firing the SCR.

Another important feature of the timing circuitry is a second delay circuit (capacitor C2) connected to the output of the transistor Q1, which operates in combination with the first delay circuit to prevent further energization of the solenoid for a predeterminable time period, even after the trigger switch 19 has reopened. Accordingly, the firing circuit 10 operates to permit only one staple or nail to be ejected and driven for each time the stapler/nailer trigger is squeezed by the operator. Until the switch 18 is reopened, the transistor Q1 will continue to be switched on during positive half cycles of the voltage signal on conductor 12 and retain a sufficient charge on capacitor C2 such that the voltage signal on conductor 23 will remain in a HI digital logic state. The HI digital logic state input to the NAND gates 28 and 30 will prevent the flip flop 24 from changing logic states after the circuit has fired. Therefore, the signal at the output of flip flop 24 on line 36 will remain LO preventing or disabling any further gating pulses from being applied to the SCR 19.

When the operator releases the trigger at some arbitrary time, as illustrated in FIG. 2, the trigger switch 18 will open and interrupt the power supply to circuit 10. This will permit the capacitor C1 to discharge through the resistor R2, and cause the transistor Q1 to switch off. This in turn will permit the capacitor C2 to discharge through the collector-to-base diode junction of the transistor Q1, and through resistors R3 and R2. When the charge on the capacitor C2, and hence the voltage on conductor 24, drops below the switching potential of the NAND gates 28 and 30 (approximately 1.6 volts), the flip flop 24 will toggle back or "reset" and bring the firing circuit 10 back to its initial state before the switch 18 was closed. The discharging of the capacitors C1 and C2 provides a time delay of approximately 60–80 milliseconds, which serves to prevent a rapid or "feathered" type of triggering action by the operator.

It will be appreciated that the above disclosed embodiment is well calculated to achieve the aforementioned objects of the present invention. In addition, it is evident that those skilled in the art, once given the benefit of the foregoing disclosure, may now make modifications of the specific embodiment described herein without departing from the spirit of the present invention. Such modifications are to be considered within the scope of the present invention which is limited solely by the scope and spirit of the appended claims.

I claim:

1. A one shot firing circuit for a portable electrical power tool having an inductive load adapted to be connected electrically in series with a source of alternating current electrical power, comprising:

manually operable normally open switch means, connected electrically in series with said inductive load and said source of alternating current electrical power, for controlling the supply of electrical power to both said firing circuit and said inductive load, such that when said normally open switch means is open the path of current flow to said inductive load is interrupted;

controlled conduction means, connected electrically in series with said normally open switch means, said inductive load and said source of alternating current electrical power, for controlling the flow of current through said inductive load after said normally open switch means is closed; and timing circuit means, connected to said controlled conduction means and responsive to the closing of said normally open switch means, for providing a predeterminable delay after said normally open switch means is closed before enabling said controlled conduction means to conduct and permit a unidirectional current impulse to flow through said inductive load sufficient to energize said inductive load.

2. The one shot firing circuit according to claim 1, wherein said timing circuit means also operates to disable further unidirectional current impulses through said inductive load once said inductive load has been energized until a predeterminable delay after said normally open switch means has opened.

3. The one shot firing circuit according to claim 2, wherein said controlled conduction means is enabled upon a positive going zero crossing of a voltage waveform from said source of alternating current electrical power such that said unidirectional current impulse generally comprises a single positive polarity half cycle current waveform from said source of alternating current electrical power.

4. The one shot firing circuit according to claim 3, wherein said timing circuit means comprises:
second controlled conduction means;
first delay circuit means for controlling the conduction of said second controlled conduction means in response to the closing of said normally open switch means;
third controlled conduction means; and
toggling circuit means for controlling the conduction of said third controlled conduction means in response to the conduction of said second controlled conduction means and a positive going zero crossing of said voltage waveform from said source of alternating current electrical power;
said conduction of said third controlled conduction means being operative to enable the conduction of said first controlled conduction means, and thereby permit said single positive polarity half cycle current waveform from said source of alternating current electrical power to flow through and energize said inductive load.

5. The one shot firing circuit according to claim 4, wherein said timing circuit means includes second delay circuit means, connected to said second controlled conduction means and responsive to the opening of said normally open switch means, for operating in combination with said first delay circuit means to disable said toggling circuit means from enabling the conduction of said third controlled conduction means for said predeterminable delay after said normally open switch means has opened.

6. The one shot firing circuit according to claim 5, wherein said first delay circuit means of said timing circuit means comprises:
half wave rectifier means for transmitting only positive polarity half cycles of said voltage waveform from said source of alternating current electrical power;
a first passive RC network in association with said half wave rectifier means, and having a first capacitor adapted to be charged over several positive polarity half cycles of said voltage waveform in response to the closing of said normally open switch means; and
threshold conduction means for enabling the conduction of said second controlled conduction means in response to the voltage across said capacitor.

7. The one shot firing circuit according to claim 6, wherein said toggling circuit means comprises:
Schmitt trigger means for converting said voltage waveform into a fast-rise square wave waveform;
a second passive RC network connected to the output of said Schmitt trigger means for generating a negative going pulse on each positive going zero crossing of said voltage waveform;
a flip flop having a first and second input, said first input being connected to the output from said second passive RC network and said second input being connected to the output from said second controlled conduction means; and
a third passive RC network, connected between the output of said flip flop and said third controlled conduction means, for enabling the conduction of said third controlled conduction means for a predetermined period in response to the toggling of said flip flop.

8. The one shot firing circuit according to claim 7, wherein the conduction of said second controlled conduction means enables said flip flop to toggle its output digital logic state upon the occurrence of the next positive going zero crossing of said voltage waveform from said source of alternating current electrical power.

9. The one shot firing circuit according to claim 8, wherein said second delay circuit means comprises a second capacitor connected to the output of said second controlled conduction means, said second capacitor being operable to prevent the toggling of said flip flop for a predeterminable delay after said second controlled conduction means has been rendered nonconductive.

10. The one shot firing circuit according to claim 9, wherein said portable electrically powered fastening device is a stapler.

11. The one shot firing circuit according to claim 9, wherein said portable electrically powered fastening device is a nailer.

12. A one shot firing circuit for a portable electrically powered fastening device having a solenoid for ejecting and driving a fastening element into an article, and a solenoid coil adapted to be connected electrically in series with an AC power source, comprising:
a manually operable normally open trigger switch, connected electrically in series with said solenoid coil and said AC power source, for controlling the supply of electrical power to both said firing circuit and said solenoid coil, such that when said trigger switch is open the path of current flow to said solenoid coil is physically interrupted, thereby isolating said solenoid coil from said AC power source;
an SCR, connected electrically in series with said trigger switch, said solenoid coil and said AC power source, for controlling the flow of current through said solenoid coil after said trigger switch is closed; and
timing circuit means, connected to said SCR and responsive to the closing of said trigger switch, for providing a predeterminable delay after said trigger switch is closed before enabling said SCR to conduct and permit unidirectional current impulse to flow through said solenoid coil sufficient to energize said solenoid, said SCR being enabled upon a positive going zero crossing of a voltage waveform from said AC power source.

13. The one shot firing circuit according to claim 12, wherein said timing circuit means also operates to disable further unidirectional current impulses through said solenoid coil once said solenoid has been energized until a predeterminable delay after said trigger switch has opened.

14. The one shot firing circuit according to claim 13, wherein said unidirectional current impulse generally comprises a single positive polarity half cycle current waveform from said AC power source.

15. The one shot firing circuit according to claim 14, wherein said timing circuit means comprises:
   a first transistor;
   first delay circuit means for controlling the conduction of said first transistor in response to the closing of said trigger switch;
   a second transistor; and
   toggling circuit means for controlling the conduction of said second transistor in response to the conduction of said first transistor and a positive going zero crossing of said voltage waveform from said AC power source;
   said conduction of said second transistor being operative to enable the conduction of said SCR, and thereby permit said single positive polarity half cycle current waveform from said AC power source to flow through and energize said solenoid coil.

16. The one shot firing circuit according to claim 15, wherein said timing circuit means includes second delay circuit means, connected to said first transistor and responsive to the opening of said trigger switch, for operating in combination with said first delay circuit means to disable said toggling circuit means from enabling the conduction of said second transistor for said predeterminable delay after said trigger switch has opened.

17. The one shot firing circuit according to claim 16, wherein said first delay circuit means of said timing circuit means comprises:
   half wave rectifier means for transmitting only positive half cycles of said voltage waveform from said AC power source;
   a first passive RC network in association with said half wave rectifier means, and having a first capacitor adapted to be charged over several positive polarity half cycles of said voltage waveform in response to the closing of said trigger switch; and
   a Zener diode for enabling the conduction of said first transistor in response to the voltage across said capacitor.

18. The one shot firing circuit according to claim 17, wherein said toggling circuit means comprises:
   Schmitt trigger means for converting said voltage waveform into a fast-rise square wave waveform;
   a second passive RC network connected to the output of said Schmitt trigger means for generating a negative going pulse on each positive going zero crossing of said voltage waveform;
   a flip flop having a first and second input, said first input being connected to the output from said second passive RC network and said second input being connected to the output from said first transistor; and
   a third passive RC network, connected between the output of said flip flop and said second transistor, for enabling the conduction of said second transistor for a predetermined period in response to the toggling of said flip flop.

19. The one shot firing circuit according to claim 18, wherein the conduction of said first transistor enables said flip flop to toggle its output digital logic state upon the occurrence of the next positive going zero crossing of said voltage waveform from said AC power source.

20. The one shot firing circuit according to claim 19, wherein said second delay circuit means comprises a second capacitor connected to the output of said first transistor, said second capacitor being operable to prevent the toggling of said flip flop for a predeterminable delay after said first transistor has been rendered non-conductive.

21. The one shot firing circuit according to claim 20, wherein said portable electrically powered fastening device is a stapler.

22. The one shot firing circuit according to claim 20, wherein said portable electrically powered fastening device is a nailer.

23. In a portable power tool adapted to be cyclically switched on and off having a relatively high amperage inductive load adapted to be connected in series with a source of electrical power, a one shot firing circuit for energizing said inductive load with a single pulse of predetermined duration, comprising:
   a manually operable normally open trigger switch and an SCR both connected electrically in series with said solenoid coil and said source of electrical power; and
   timing circuit means, connected generally in parallel with said SCR and having an output connected to the gate of said SCR, said timing circuit means being responsive to the closing of said trigger switch for providing a predeterminable delay after said trigger switch is closed before enabling said SCR to conduct and permit a unidirectional current impulse to flow through said solenoid coil sufficient to energize said solenoid, and for disabling further unidirectional current impulses through said solenoid coil for a predeterminable delay after said trigger switch is opened.

24. The one shot firing circuit according to claim 23, wherein said trigger circuit means also operates to enable the conduction of said SCR upon a positive going zero crossing of a voltage waveform from said source of electrical power, such that said unidirectional current impulse generally comprises a single positive polarity half cycle current waveform from said AC power source.

25. A one shot firing circuit for a portable electrically powered fastening device having an inductive load adapted to be connected electrically in series with a source of alternating current electrical power, comprising:
   manually operable normally open switch means connected electrically in series with said inductive load and said source of alternating current electrical power, for controlling the supply of electrical power to both said firing circuit and said inductive load, such that when said normally open switch means is open the path of current flow to said inductive load is interrupted;
   controlled conduction means connected electrically in series with said normally open switch means, said inductive load and said source of alternating current electrical power, for controlling the flow of current through said inductive load after said normally open switch means is closed;
   first controlled conduction device;
   first delay circuit means for controlling the conduction of said first controlled conduction device in response to the closing of said normally open switch means, such that a predeterminable delay is provided after said normally open switch means is closed before said first controlled conduction device is rendered conductive;

a second controlled conduction device; and toggling circuit means for controlling the conduction of said second controlled conduction device in response to the conduction of said first controlled conduction device and a positive going zero crossing of said voltage waveform from said source of alternating current electrical power;

said conduction of said third controlled conduction means being operative to enable the conduction of said first controlled conduction means, and thereby permit a unidirectional current impulse from said source of alternating current electrical power to flow through and energize said inductive load.

26. The one shot firing circuit according to claim 25, wherein said firing circuit includes second delay circuit means, connected to said first controlled conduction device and responsive to the opening of said normally open switch means, for operating in combination with said first delay circuit means to disable said toggling circuit means from enabling the conduction of said second controlled conduction device for said predeterminable delay after said normally open switch means has opened.

27. The one shot firing circuit according to claim 26, wherein said unidirectional current impulse generally comprises a single positive polarity half cycle current waveform from said source of alternating current electrical power.

28. The one shot firing circuit according to claim 27, wherein said first delay circuit means comprises;

half wave rectifier means for transmitting only positive polarity half cycles of said voltage waveform from said source of alternating current electrical power;

a first passive RC network in association with said half wave rectifier means, and having a first capacitor adapted to be charged over several positive polarity half cycles of said voltage waveform in response to the closing of said normally open switch means; and threshold conduction means for enabling the conduction of said first controlled conduction device in response to the voltage across said capacitor.

29. The one shot firing circuit according to claim 28, wherein said toggling circuit means comprises:

Schmitt trigger means for converting said voltage waveform into a fast-rise square wave waveform;

a second passive RC network connected to the output of said Schmitt trigger means for generating a negative going pulse on each positive going zero crossing of said voltage waveform;

a flip flop having a first and second input, said first input being connected to the output from said second passive RC network and said second input being connected to the output from said first controlled conduction device; and a third passive RC network, connected between the output of said flip flop and said second controlled conduction device, for enabling the conduction of said second controlled conduction device for a predetermined period in response to the toggling of said flip flop.

30. The one shot firing circuit according to claim 29 wherein the conduction of said first controlled conduction device enables said flip flop to toggle its output digital logic state upon the occurrence of the next positive going zero crossing of said voltage waveform from said source of alternating current electrical power.

31. The one shot firing circuit according to claim 30, wherein said second delay circuit means comprises a second capacitor connected to the output of said first controlled conduction device, said second capacitor being operable to prevent the toggling of said flip flop for a predeterminable delay after said first controlled conduction device has been rendered nonconductive.

32. The one shot firing circuit according to claim 31, wherein said portable electrically powered fastening device is a stapler.

33. The one shot firing circuit according to claim 31, wherein said portable electrically powered fastening device is a nailer.

* * * * *